US006828178B2

(12) United States Patent
Matsumura et al.

(10) Patent No.: US 6,828,178 B2
(45) Date of Patent: Dec. 7, 2004

(54) THIN FILM SEMICONDUCTOR DEVICE HAVING ARRAYED CONFIGURATION OF SEMICONDUCTOR CRYSTALS AND A METHOD FOR PRODUCING IT

(75) Inventors: Masakiyo Matsumura, Yokohama (JP); Yasuhisa Oana, Yokohama (JP); Hiroyuki Abe, Yokohama (JP); Yoshitaka Yamamoto, Yokohama (JP); Hideo Koseki, Yokohama (JP); Mitsunori Warabisako, Yokohama (JP)

(73) Assignee: Advanced LCD Technologies Development Center Co., Ltd., Yokohama (JP)

( * ) Notice: Subject to any disclaimer, the term of this patent is extended or adjusted under 35 U.S.C. 154(b) by 0 days.

(21) Appl. No.: 10/192,850

(22) Filed: Jul. 11, 2002

(65) Prior Publication Data

US 2003/0027410 A1 Feb. 6, 2003

(30) Foreign Application Priority Data

Jul. 18, 2001 (JP) ........................................ 2001-218370

(51) Int. Cl.$^7$ .............................................. H01L 21/84
(52) U.S. Cl. ........................ 438/149; 438/150; 438/489
(58) Field of Search ................................ 438/149, 150, 438/154, 489

(56) References Cited

U.S. PATENT DOCUMENTS 5,977,559 A * 11/1999 Zhang et al. .................. 257/57
6,548,830 B1 * 4/2003 Noguchi et al. ............... 257/66

FOREIGN PATENT DOCUMENTS

| JP | 6-289431 A | | 10/1994 |
| JP | 11-145484 | * | 5/1999 |
| JP | 2000-82669 A | | 3/2000 |
| JP | 2001-144296 A | | 5/2001 |

OTHER PUBLICATIONS

Nakata et al, "A New Nucleation–Site–Control ExcimerLaser Crystallization Method" Japanese Journal of Applied Physics, vol. 40 (2001), Part 1, No. 5A, pp. 3049–3054.
Oh et al. "Preparation of Position–Controlled Crystal–Silicon Island Arrays by Means of Excimer–Laser Annealing", Oct. 1998.

* cited by examiner

*Primary Examiner*—Caridad M. Everhart
(74) *Attorney, Agent, or Firm*—Morrison & Foerster LLP

(57) ABSTRACT

A thin film semiconductor device and a method for producing it are described. In the thin film layer of semiconductor of the device, a plurality of large size single-crystalline grains of semiconductor are formed in a regulated configuration, and each of single crystalline grains is equipped with one unit of electric circuit having a gate electrode, a source electrode and drain electrode. Such regulated arrangement of large size single-crystalline grains in the semiconductor layer is realized by a process including a step of irradiating the layer of amorphous or polycrystalline semiconductor with energy beam such as excimer laser so that maximum irradiation intensity points and minimum irradiation intensity points are arranged regulatedly. The device can have a high mobility such as about 500 cm$^2$/V sec.

13 Claims, 5 Drawing Sheets

THIN FILM SEMICONDUCTOR DEVICE HAVING ARRAYED CONFIGURATION OF SEMICONDUCTOR CRYSTALS AND A METHOD FOR PRODUCING IT

BACKGROUND OF THE INVENTION

The present invention relates to a thin film semiconductor device and a semiconductor substrate sheet to be used in the semiconductor device as well as a method for producing them.

As is well known, a thin film semiconductor device or thin film transistor (TFT) comprises a substitute, in which a thin film layer of semiconductor materials such as silicon is formed on a base layer of insulation materials such as non-alkaline glass, or quarts glass. In the thin film layer of semiconductor, a plurality of channel consisting of a source area and a drain area are formed and each of channels is equipped with a gate electrode. Generally, the thin film layer of semiconductor consists of amorphous or polycrystalline silicon. However, a TFT using a substrate comprising a thin film layer of amorphous silicon cannot be used for a device which requires a high speed operation owing to its extreme low mobility(usually, approximately less than 1 $cm^2$/V sec). Therefore, recently, a substrate comprising a thin film layer of polycrystalline silicon is used in order to increase the mobility. Nevertheless, even in a case of using such substrate, the improvement of mobility is limited because of such phenomenon at the time of operation as dispersion of electron at boundaries between crystal grains, owing to the fact that the polycrystalline thin film consists of numerous crystalline grains of extreme small size.

Thus, it has been tried to obtain a substrate having a thin film layer which makes it possible to increase mobility by avoiding disadvantageousness such as electron dispersion, by means of making the size of polycrystalline silicon to be large. For instance, it has been tried to obtain a thin film layer having a semiconductor grains of about 1 $\mu$m size and having a mobility of about 100 $cm^2$/V sec., by annealing a layer of polycrystalline silicon in a high temperature furnace. However, the above process has a disadvantage that inexpensive glass sheets such as sodium glass sheets cannot be used and expensive quartz glass sheets which can bear high temperature should be used, as the process requires an annealing by extreme high temperature such as over 1000° C. A substrate using such expensive materials is not suited for producing a device of wide size screens in view of costs.

Some other trials has been proposed in order to obtain a thin layer which consists of polycrystalline semiconductor of large size grains, by means of irradiating a thin film of amorphous or polycrystalline semiconductor with energy beams such as excimer laser, instead of using high temperature annealing. By this method, it is possible to enlarge the size of a crystal grain, by using inexpensive glass sheets as the base layer.

Nevertheless, even by the method using irradiation of excimer laser, the size of obtained crystal grain could not exceed 1 $\mu$m and it is inevitable that sizes of grains become uneven. For instance, in the specification of JPA 2001-127301, there is described a technology for obtaining a thin film layer of polycrystalline semiconductor of large size crystal grains comprising following steps; that is, polycrystalline a thin film of amorphous silicon by a melt recrystallization method, for example, using excimer laser irradiation, then depositing a thin layer of amorphous silicon on the recrystallized layer and, crystallizing the whole layers by solid phase growing method, thereby growing original polycrystalline grains to large size grains. However, in the above technique, it is suggested that the maximum size of obtained crystal grain is about 1000 nm(1 $\mu$m) and sizes are uneven (cf. FIGS. 2 to 5 in the above specification)

Furthermore, there is an important problem, which has been neglected in the technique of semiconductor device comprising polycrystalline semiconductor, that is, the problem of arrangement mode of crystal grains. In the thin layer of polycrystalline semiconductor produced by previous techniques, the arrangement mode of crystal grains in the two-dimensional direction is utterly random. No trial for making such arrangement of crystal grains to be a regulated mode has been made. But, randomness of arrangement of crystal grains causes a serious disadvantage.

That is, it would be needless to say that the numerous units of transistor circuits formed in a thin film semiconductor device have to be arranged in a regulated mode such as geometrical arrangement mode. Therefore, when the sizes of crystal grains are uneven and the arrangement thereof are random (not regulated) in a thin film layer, an unit circuit of one transistor is inevitably set in such a modem to extend to a plurality of crystal grains of various sizes and positions (cf. FIG. 6). This would bring such result that the mobility and the electron transfer mode of each unit circuit are different one another, and this in turn would bring a bad influence to the quality of the device. As the result, when characteristics of every unit circuits differs each other, a device cannot but be designed on the whole by being based on the low level characteristics. This is an important problem to be solved.

SUMMARY OF THE INVENTION

It is an object of the present invention to provide a substrate sheet for thin film semiconductor devices, in which a plurality of large size single crystalline grains of semiconductor are formed in a regulated arrangement mode such as a matrix-arrayed configuration, thereby making it possible to use it as the substrate sheet for a thin film semiconductor device in which an unit circuit comprising a source electrode, a drain electrode and a gate electrode is formed on each of crystal grain.

It is further object of the present invention to provide a thin film semiconductor device, which has a high mobility without being influenced by disadvantage such as unevenness of crystal grain size or electron dispersion occurred in crystal grain boundaries, by means of setting an unit circuit comprising a source electrode, a drain electrode and a gate electrode on each of crystal grains which are arranged regulatedly in such mode as a matrix-arrayed configuration in the thin film layer of semiconductor.

It is another object of the present invention to provide a process for producing a substrate sheet for a thin film semiconductor devices in which a plurality of large size single crystalline grains of semiconductor are formed in a regulated arrangement mode such as a matrix-arrayed configuration.

It is another further object of the present invention to provide a process for producing a thin film semiconductor device in which an unit circuit comprising a source electrode, a drain electrode and a gate electrode are formed on each of crystal grains which are arranged regulatedly in such mode as a matrix-arrayed configuration in the thin film layer of semiconductor.

Thus, the substrate sheet for thin film semiconductor device of the present invention comprises; a base layer of insulation materials, a thin film layer of semiconductor formed on the base layer, a plurality of single-crystalline semiconductor grains formed in the thin film layer of semiconductor and, said plurality of single-crystalline semiconductor grains being arranged in a regulated configuration such as a matrix-arrayed configuration in the thin film layer of semiconductor.

The thin film semiconductor device of the present invention comprises; a base layer of insulation materials, a thin film layer of semiconductor formed on the base layer, a plurality of single-crystalline semiconductor grains formed in the thin film layer of semiconductor, said plurality of single-crystalline semiconductor grains being arranged in a regulated configuration such as a matrix-arrayed configuration and, each of said single-crystalline semiconductor grains being equipped with an electric circuit comprising a gate electrode, a source electrode and a drain electrode.

The method for producing a substrate sheet for thin film semiconductor devices according to the present invention comprises following steps; namely, (a) forming a thin film semiconductor layer of non-single-crystalline semiconductor such as amorphous or polycrystalline semiconductor on a base layer of insulation materials and,
(b) crystallizing or recrystallizing said non-single-crystalline semiconductor to produce a plurality of single-crystalline semiconductor grains by irradiating it with energy beams, said irradiation being carried out so that irradiated points to which maximum irradiation intensity is given and irradiated points to which minimum irradiation intensity is given are arranged in a regulated configuration such as a matrix-arrayed configuration.

The process for producing a thin film semiconductor device of the present invention comprises following steps; namely, (a) forming a thin semiconductor layer of amorphous or polycrystalline semiconductor on a base layer of insulation materials,
(b) crystallizing or recrystallizing said amorphous or polycrystalline semiconductor to produce a plurality of single-crystalline semiconductor grains by irradiating it with energy beams, said irradiation being carried out so that irradiated points to which maximum irradiation intensity is given and irradiated points to which minimum irradiation intensity is given are arranged in a regulated configuration such as a matrix-arrayed configuration,
(c) forming a gate electrode on each of single-crystalline grains in the thin film semiconductor layer, which has been produced by said step (b) and,
(d) fabricating an electric circuit in each of said single-crystalline semiconductor grains by forming a source electrode and a drain electrode therein.

DETAILED DESCRIPTION OF PREFERRED EMBODIMENTS OF THE INVENTION

Figure 1A:
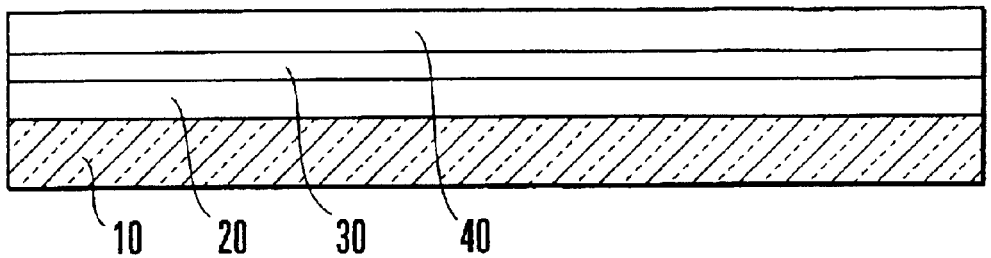
FIGS. 1a to 1d is pattern diagrams showing steps of one embodiment of the process according to the present invention for manufacturing a thin film semiconductor device.
Figure 1B:
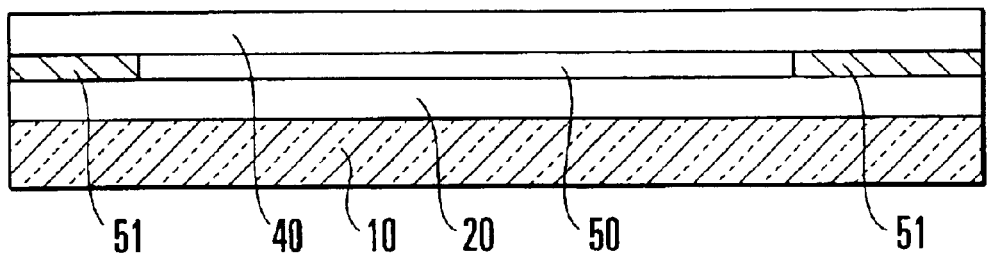
Figure 1C:
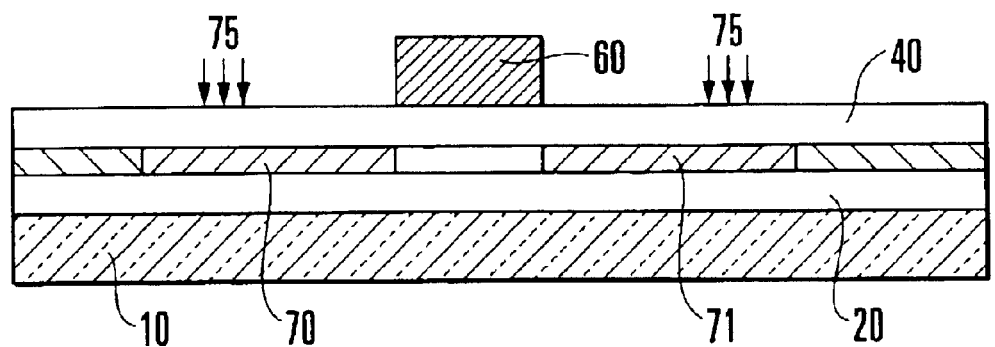
Figure 1D:
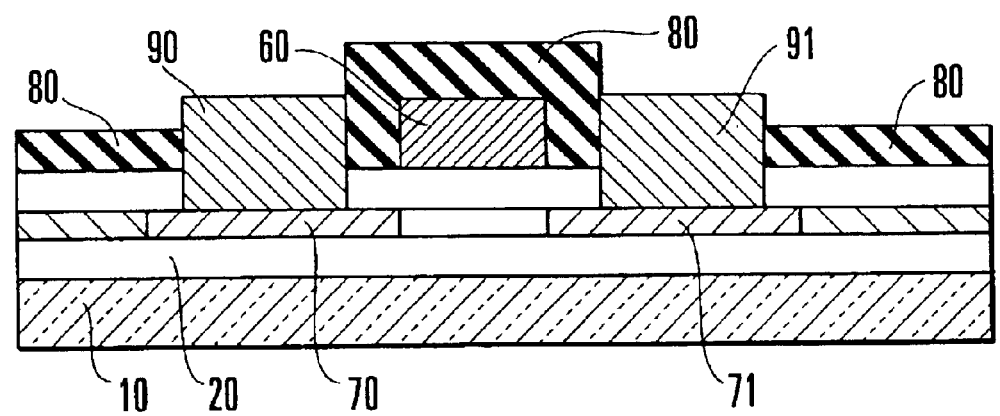

In the thin film semiconductor device of the present invention, it is preferred to use a glass sheet having a strain point not exceeding 700° C. as the material of base layer of substrate sheet. But, it is possible to use various kinds insulation materials other than glass, for example, ceramics or plastic films having appropriate heat resistance.

On the above base layer, a thin film of semiconductor in which single crystalline semiconductor grains are arranged in a regulated arrangement mode such as a matrix-arrayed mode is formed. The formation of the thin film layer is carried out by depositing a layer of semiconductor of non-single crystalline character on the base layer, and then, by changing the deposited layer to a layer of polycrystalline semiconductor which includes large size crystal grains, by means of irradiation of energy beams such as excimer laser beam.

As the semiconductor of non-single crystalline character, amorphous semiconductor or polycrystalline semiconductor consisting of small size polycrystalline grain may be used. By the process according to the present invention, any type of the above semiconductor can be changed to a thin film semiconductor of the preset invention, by crystallizing or recrystallizing them. It is desired that the thickness of thin film semiconductor layer is 10 through 200 nm, especially 50 through 150 nm.

Usually, when a semiconductor layer of the above non-single crystalline character is formed on the base layer, a thin control layer for adjusting heat-conduction and crystallization-orientation consisting of such materials as silicon oxide, silicon nitride (SiNx) is formed between the base layer and the semiconductor layer. This layer has such functions as to block the diffusion of impurities such as glass components from the base layer to the semiconductor layer and to bring the intentional uniformity of heat distribution of the semiconductor layer for controlling the orientation of crystals. The thickness thereof is desired to be 20 through 1000 nm, especially 200 through 300 nm.

It is also usual to form the second control layer for adjusting heat-conduction and crystallization further on the above non-single crystalline semiconductor layer (the first control layer). This second control layer has a function same as the first control layer, namely, to bring the uniformity of heat distribution and to control the orientation of crystals in the semiconductor layer in the process of crystallization by irradiation. Materials such as silicon-oxide, silicon-nitride, silicon-oxi-nitride or silicon-carbonate (SiC) can be used therefor. The thickness of the layer is desired to be 50 through 500 nm, especially 100 through 800 nm.

When the above two control layers are formed, the thin film semiconductor layer is formed between the two control layers. In this case, firstly the material of the first control layer is deposited as a thin film on the base layer of insulation material, then, the material of thin film of non-single crystalline semiconductor is deposited on the first control layer, and further, the material of the second control layer is deposited on the above semiconductor layer. Thereafter, the irradiation of energy beams from the upper side is carried out to crystallize or recrystallize the layer of non-single crystalline material.

Now referring to (a) through (d) in FIG. 1, which shows an embodiment of each stages of the process according to the present invention, (a) shows the first stage of deposition of layers, where the first control layer 20 for adjusting heat-conduction and crystallization is deposited on the base layer 10, and non-single crystalline layer 30 of amorphous or polycrystallize semiconductor is deposited on the first control layer 20. Further, second control layer 40 is deposited on the non-single crystalline layer 30.

As shown in (b), non-single crystalline layer 30 shown in (a) is changed to a layer consisting of single-crystalline area 50 and non-single crystalline area 51, by irradiation of energy beams. It is of course that (b) shows the sectional pattern view of one single-crystalline area and a substrate sheet of the present invention comprises of a plurality of such single-cystalline semiconductor area.

Next, as shown in (c), gate electrode 60 is formed on the substrate sheet and, source area 70 and drain area 71 are formed in the single crystalline semiconductor area 50 by implanting donor impurities 75 such as phosphorous ions there into, using gate electrode 60 as the implantation-mask.

Further, as shown in (d), an insulation layer 80 of such material as silicon oxide is deposited on the second control layer 40 and, after perforating contact-holes through the second control layer 40 and the insulation layer 80, source electrode 90 and drain electrode 91 are formed by deposition of Aluminum (Al)/Molybdenum (Mo) into the contact-holes and by patterning it, thereby completing a thin film semiconductor device.

In the above step (b), it is preferable to use the excimer laser irradiation as the means for irradiation. However, irradiation means other than the excimer laser, for example, pulsed argon lasers or YAG lasers, may be used.

In order to obtain a thin film semiconductor layer in which single crystalline semiconductor grains are arranged in a regulated alignment mode such as a matrix-arrayed configuration mode by irradiation of energy beams, the irradiation should be carried out in such energy intensity distribution mode as in which the irradiation energy intensity changes successively in two-dimensional directions between the maximum value and the minimum value at every predetermined intervals, and maximum points and minimum points appear one after another in order. In other words, the irradiation should be carried out so that irradiated points to which maximum irradiation intensity is given and irradiated points to which minimum irradiation intensity is given are arranged in a regulated configuration such as a matrix-arrayed configuration mode.

Figure 2:
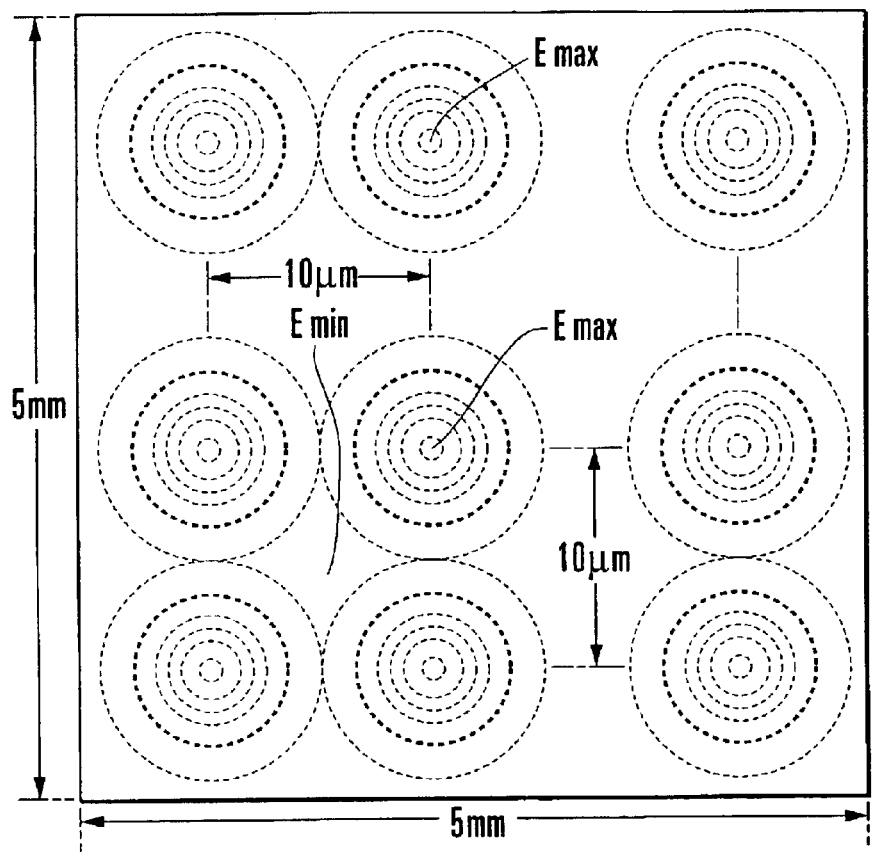
FIG. 2 is a pattern diagram for illustrating one embodiment of distribution state energy beam intensity in two-dimensional directions in the irradiation step according to the process of the present invention.
Figure 3:
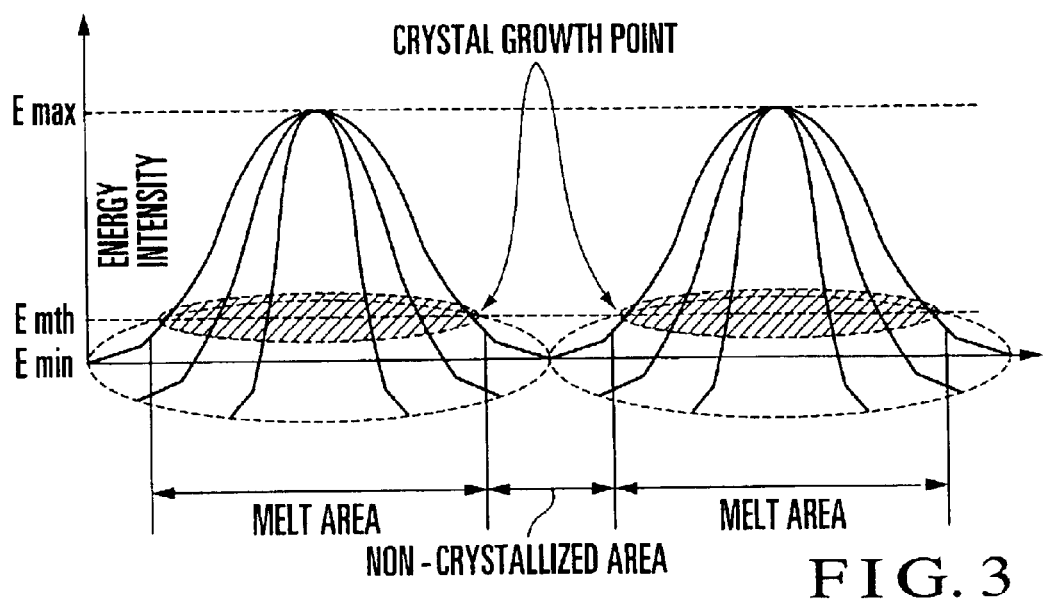
FIG. 3 is a pattern diagram illustrating a profile of variation of energy beam intensity between a maximum value and a minimum value in the process according to the present invention.
Figure 7:
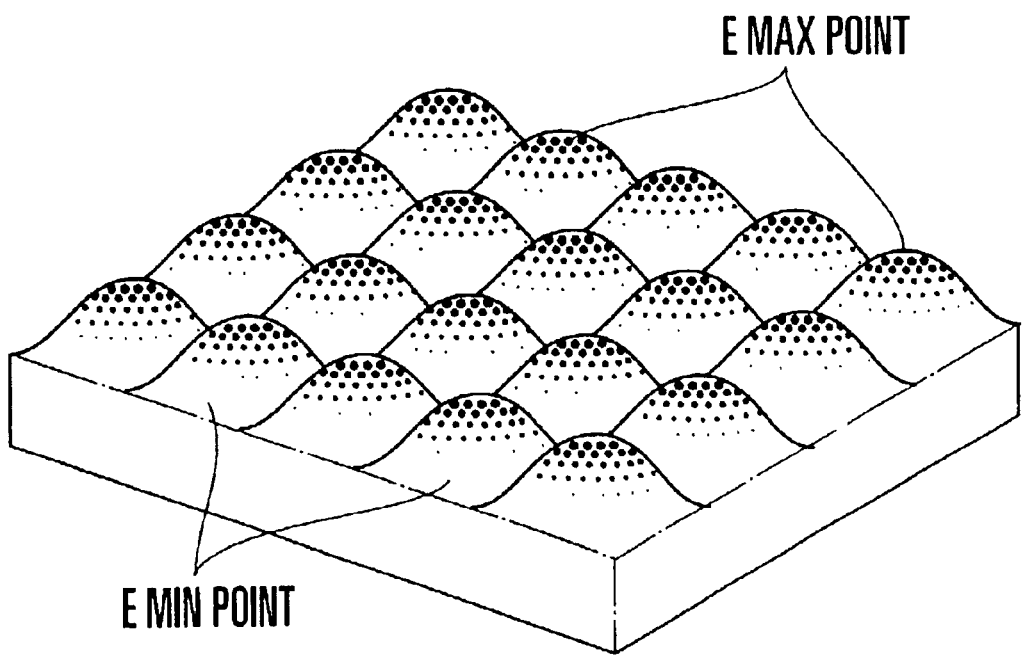
FIG. 7 is a pattern diagram illustrating the pattern of configuration of maximum intensity irradiation points and minimum intensity irradiation points such as mentioned in FIGS. 2 through 4, with a three-dimensional model pattern.

For example, as shown in FIGS. 2, 3 and 7, the irradiation is carried out in the intensity distribution mode in which irradiation energy repeats such change as "maximum value (Emax)→minimum value(Emin)→maximum value(Emax)" two-dimensionally(in the x, y both directions) in a rectangle region of 5×5 mm, at every intervals of 10 $\mu$m. The above change of irradiation energy intensity can be realized by bringing the variation of the irradiation energy intensity distribution, using a phase shift mask. And, it is desirable that the mode of change between the maximum value and the minimum value is a successive change substantially as shown in FIG. 3.

Determination of the degree of the maximum value and the minimum value to how much value may be based on the film thickness of the non-crystalline semiconductor layer as well as the film thickness and the thermal conductivity of the first and the second control layers. For example, the minimum energy intensity may be determined to be an intensity which brings the temperature which doesn't melt the thin film semiconductor during the irradiation period, and the maximum value may be determined to be an intensity which is necessary and sufficient to melt the thin film semiconductor during the irradiation period. A melting threshold level (Emth) should be existed between the maximum value (Emax) and the minimum value (Emin), as shown in the FIG. 3.

It is of course that the face shape of the irradiation beam is not limited to a square shape of 5×5 mm mentioned above and may be various polygon shapes. Further, the arrangement mode of maximum value points and minimum value points is not limited to the rectangular lattice mode and may be various shape modes, for example, the mode of delta shaped lattice.

Figure 4:
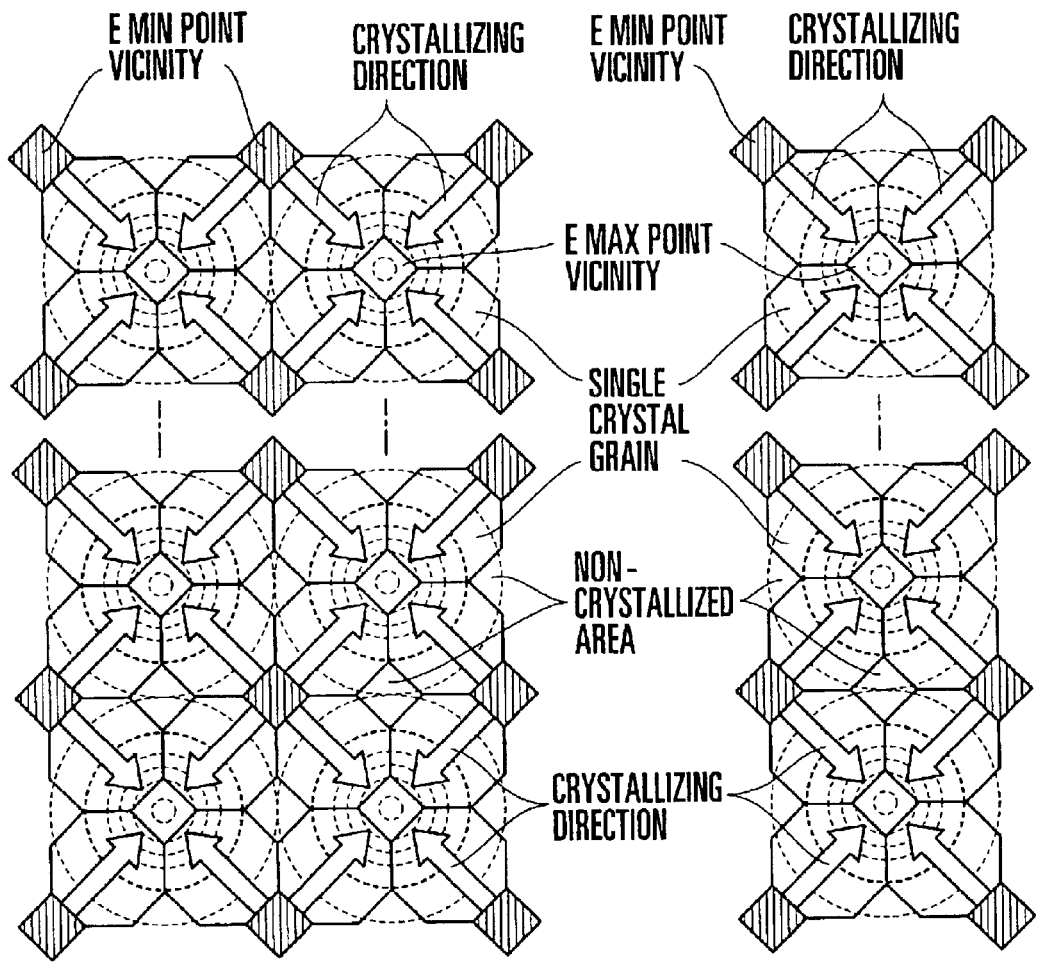
FIG. 4 is a pattern diagram illustrating an alignment state of single crystalline grains after finishing the irradiation of energy beams in the process according to the present invention.

By carrying out the irradiation of energy beams to the thin film semiconductor, areas to which the minimum energy intensity (namely, the intensity less than the melting threshold value)is irradiated are not completely melted, and therefore, the crystal nucleus are firstly formed in this areas. Then, crystals become to grow in the two dimensional direction towards the Emax point, as shown by arrows mentioned in FIG. 4. On the other hand, in areas of maximum energy intensity points where the temperature becomes highest and in areas which become to be regions of crystal growth, the formation of minor size or fine size crystals or boundaries of large size crystal are resulted, owing to mutual jamming of growing crystals having different direction of growth. Thus, as the result, a substrate sheet of thin film semiconductor comprising a plurality of single-crystalline semiconductor, which are formed at areas nearby the melting threshold points and each of which has a crystal size over 4 $\mu$m, can be obtained (cf. FIG. 4).

The size of the single crystal can be adjusted by varying the intervals between maximum point of irradiation energy. For instance, when the irradiation of XeCl excimer laser of 308 nm wave length is carried out by making the intervals between maximum intensity point to be 12 $\mu$m, a substrate sheet of thin film semiconductor, in which single crystal grains of nearly 5 $\mu$m size are arranged regularly, can be obtained. It is desirable that, as the substrate sheet to be used for the thin film semiconductor device of the present invention, the size of each single crystal grain in the substrate sheet is not less than 2 $\mu$m.

Then, on each of single crystalline grains in the thin film semiconductor substrate sheet obtained by the process as mentioned above, the electrode materials such as Molybdenum-Tungsten alloy (MoW) is deposited with an appropriate thickness (for example, 300 nm), thereby forming a gate electrode. Then, after forming a source area and a drain area respectively using the gate electrode as the implantation-mask, an isolating-interlayer, with insulation materials such as silicon oxide, which covers the gate electrode is formed. Further, after forming contact holes by perforating through the second control layer at the position above the source area and the drain area, electrode materials such as aluminum/Molybdenum are deposited and patterned in the contact hole.

Figure 5A:
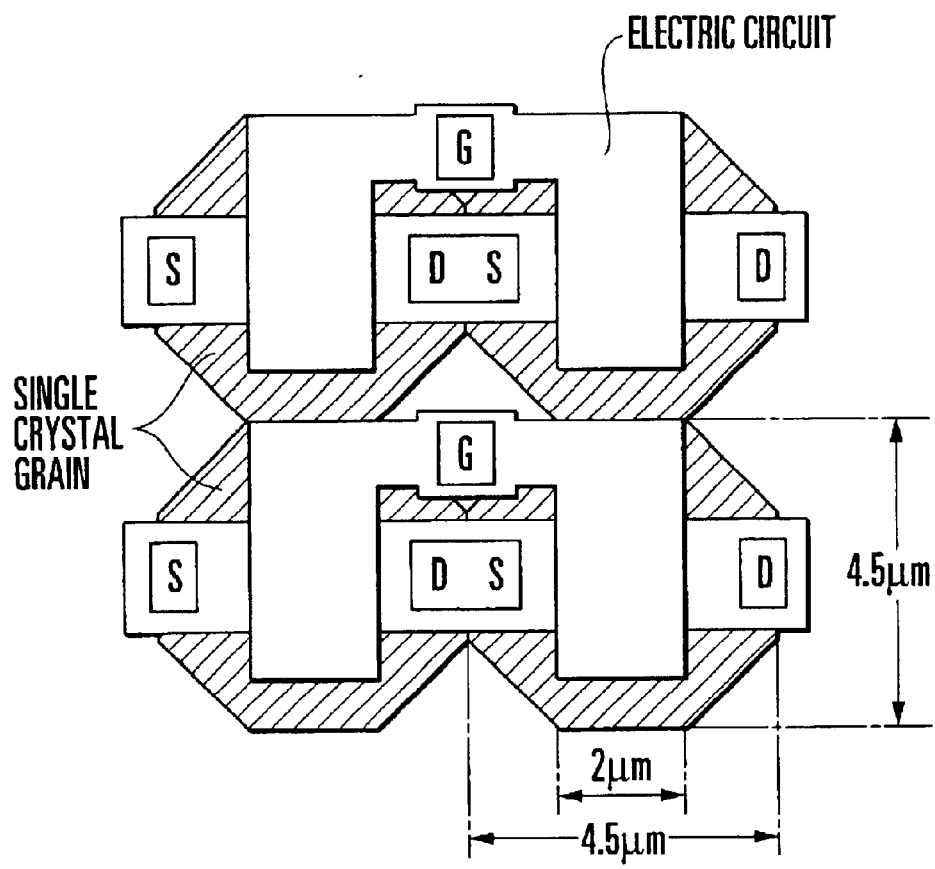
FIGS. 5a and 5b is the pattern diagrams illustrating embodiments of the positional relationship of electrodes with crystal grain in the thin film semiconductor device of the present invention.
Figure 5B:
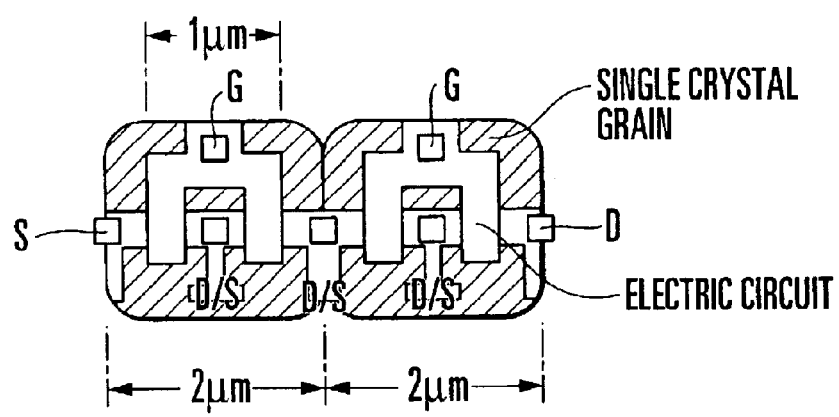
Figure 6:
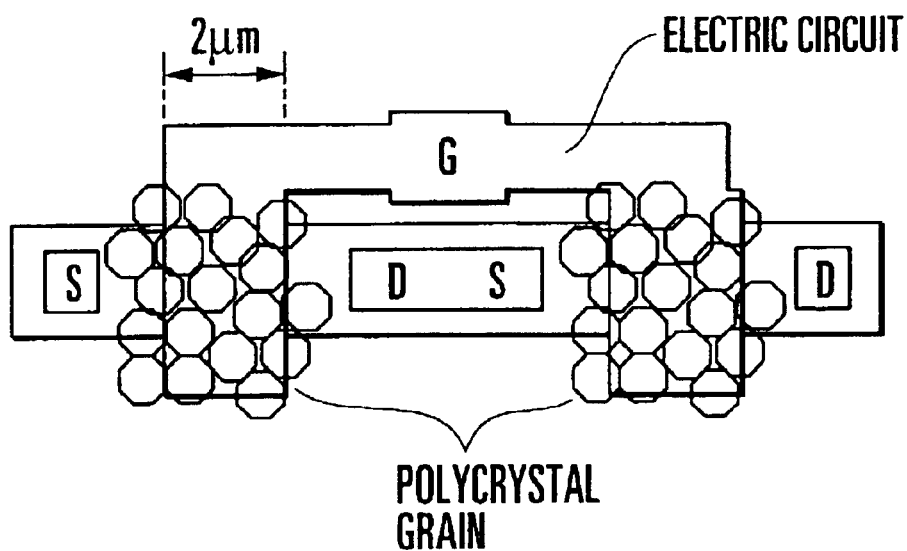
FIG. 6 is a pattern diagram illustrating the positional relationship of electrodes with crystal grains in the thin film semiconductor devices.

Thus, as shown in (a) and (b) of FIG. 5, a thin film semiconductor device, in which one unit electric circuit in each of single crystals is arranged regulatedly, can be obtained. A thin film semiconductor device of this type can have a high mobility (for example, over 300 cm$^2$/V.sec) exceeding the mobility of conventional devices in which a substrate sheet comprising polycrystalline semiconductor film is used.

It is possible to omit the setting of electrodes for some of single crystals or to set plural units of circuit for one single crystal. Further, though the above explanation is described on the production of a thin film transistor of N-channel type, it is possible to apply the technique of the present invention to a transistor of CMOS type, by making partial masking and doping impurities one after another. It is also possible, instead of using the second control layer as the gate insulator, to remove the second control layer by etching after forming the layer of single crystals, and forming a new gate insulation layer at the removed portions. "Islands separation", by using etching method before or after the crystallization process, may be carried out, when there is a possibility of occurrence of current leakage between adjoining transistors.

EXAMPLE

A non-alkali grass sheet, manufactured by Corning Glass Works, with the outside dimension of 400×500 mm, the thickness of 0.7 mm and the strain point of 650° C. was prepared as the base layer. On the surface of the base layer, the first control layer of 200 nm thickness for adjusting heat conduction and crystallization was formed by depositing silicon oxide (SiO$_2$) with plasma CVD method. On the first control layer, a layer of amorphous silicon with 50 nm thickness was deposited, and further, the second control layer of silicon oxide with 200 nm thickness was deposited on the amorphous silicon layer. These forming of layers by the deposition of materials were carried out successively in a condition not exposed to the atmosphere.

Next, after annealing and dehydrating the layer of amorphous silicon, crystallized it by the irradiation of pulsed excimer laser beam of 308 nm wave length from the upper side.

The irradiation was carried out by using and an unit of excimer laser beam in which the beam face was so shaped as to a rectangle of 5×5 mm and given with intensity distribution therein by using a phase shift mask. The mode of intensity distribution was such that 250 thousands of maximum value points were arrayed at 10 $\mu$m intervals in the form of square-lattice, in the rectangle of 5×5 mm. The melting threshold value was approximately 0.5 J/cm$^2$, the maximum value and minimum value of laser beam intensity were 1.8 J/cm$^2$ and 0.1 J/cm$^2$ respectively.

The excimer laser irradiation by the above mode was carried out towards the whole surface to be irradiated, by moving the position of irradiation stepwise at 5 mm intervals.

After finishing irradiation, the irradiated sample was subjected to be etching treatment by using SECCO etching method and to observation of the crystal size and the shape of grain-boundary in the irradiated layer. As the result of observation by using an electron microscope, it was confirmed that a substrate sheet in which grains of single crystal of nearly 4 $\mu$m size were arrayed in a matrix lattice form was obtained.

Next, on the second control layer, a layer of Molybdenum-Tungsten alloy (MoW) was deposited with 300 mn thickness by a sputtering method and patterning it, at the position corresponding to each single crystal, to from a gate electrode. Then source areas and drain areas were formed by implanting phosphorous ions using the gate electrode as the mask, and the interlayer insulator was formed by depositing silicon oxide by a plasma CVD method. Further, contact holes were perforated in the second control layer and interlayer insulator and, by forming aluminum films in contact holes, completed a thin film semiconductor device. It was confirmed that this device shows the average mobility of 496 cm$^2$/V.sec.

What is claimed is:

1. A method for producing a thin film semiconductor device comprising steps of:
    (a) forming a thin film semiconductor layer of non-single-crystalline semiconductor on a base layer of insulation materials,
    (b) crystallizing said non-single-crystalline semiconductor to produce a plurality of single-crystalline semiconductor grains by irradiating the non-single-crystalline semiconductor with an energy beam, said irradiation being carried out so that irradiated points to which maximum irradiation intensity is given and irradiated points to which minimum irradiation intensity is given are arranged in a matrix-arrayed configuration, wherein the energy beam provides variations in energy intensity in two-dimensions, such that the maximum intensity points and minimum intensity points are arranged to have melting threshold value points interposed therebetween.
    (c) forming a gate electrode on each of single-crystalline grains in the thin film semiconductor layer, which has been produced by said step (b), separating the gate electrode from the thin film semiconductor layer by an insulation layer and,
    (d) fabricating an electric circuit in each of said single-crystalline semiconductor grains by forming a source electrode and a drain electrode therein.

2. A method for producing a thin film semiconductor device of claim 1, wherein the maximum irradiation intensity is of such high value that which is sufficient to melt the non-single-crystalline semiconductor and the minimum irradiation intensity is of such low value that which does not cause the non-single-crystalline semiconductor to be melted.

3. A method for producing a thin film semiconductor device of claim 1, wherein the variation of irradiation intensity between the maximum value and the minimum value is successive.

4. A method for producing a thin film semiconductor device of claims 1, 2, or 3, wherein an excimer laser beam is used as the energy beam.

5. A method for producing a thin film semiconductor device of claim 1, wherein the non-single-crystalline semiconductor is amorphous semiconductor.

6. A method for producing a thin film semiconductor device of claim 1, wherein the non-single-crystalline semiconductor is polycrystalline semiconductor.

7. A method for producing a thin film semiconductor device of claim 1, wherein plural units of electric circuit are formed on each single crystal grain.

8. A method for producing a thin film semiconductor device of claim 1, wherein the electric circuit is formed as a circuit of CMOS type transistor.

9. A method for producing a thin film semiconductor device comprising steps of:

(a) forming a thin film semiconductor layer of non-single crystalline semiconductor on the first control layer for adjusting heat-conduction and crystallization which is formed on a base layer consisting of insulation materials, (b) forming the second control layer for adjusting heat-conduction and crystallization on the thin film semiconductor layer formed by the step (a), (c) crystallizing said non-single-crystalline semiconductor to produce a plurality of single-crystalline semiconductor grains by irradiating the non-single-crystalline semiconductor with an energy beam, said irradiation being carried out so that irradiated points to which maximum irradiation intensity is given and irradiated points which minimum irradiation intensity is given are arranged in a matrix-arrayed configuration, wherein the energy beam provides variations in energy intensity in two-dimensions, such that the maximum intensity points and minimum intensity points are arranged to have melting threshold value points interposed therebetween, (d) forming a gate electrode on each of single-crystalline grains in the thin film semiconductor layer, which has been produced by said step (c), separating the gate electrode from the thin film semiconductor layer by an insulation layer and, (e) fabricating an electric circuit in each of said single-crystalline semiconductor grains by forming a source electrode and a drain electrode therein.

10. A method for producing a thin film semiconductor device of claim 9, wherein the maximum irradiation intensity is of such high value that which is sufficient to melt the non-single-crystalline semiconductor and the minimum irradiation intensity is of such low value that which does not cause the non-single-crystalline semiconductor to be melted, and having a melting threshold value interposed therebetween.

11. A method for producing a thin film semiconductor device of claim 9, wherein the variation of irradiation intensity between the maximum value and the minimum value is successive.

12. A method for producing a thin film semiconductor device of claim 9, wherein plural units of electric circuit are formed on each single crystal grain.

13. A method for producing a thin film semiconductor device of claim 9, wherein the electric circuit is formed as a circuit of CMOS type transistor.

* * * * *